United States Patent
Cao et al.

(10) Patent No.: US 11,762,721 B2
(45) Date of Patent: Sep. 19, 2023

(54) METHOD FOR REALIZING NGRAPH FRAMEWORK SUPPORTING FPGA REAR-END DEVICE

(71) Applicant: INSPUR ELECTRONIC INFORMATION INDUSTRY CO., LTD., Shandong (CN)

(72) Inventors: Fang Cao, Shandong (CN); Zhenhua Guo, Shandong (CN); Li Wang, Shandong (CN); Kai Gao, Shandong (CN)

(73) Assignee: INSPUR ELECTRONIC INFORMATION INDUSTRY CO., LTD., Shandong (CN)

( * ) Notice: Subject to any disclaimer, the term of this patent is extended or adjusted under 35 U.S.C. 154(b) by 0 days.

(21) Appl. No.: 18/012,924

(22) PCT Filed: Oct. 27, 2020

(86) PCT No.: PCT/CN2020/123809
§ 371 (c)(1),
(2) Date: Dec. 25, 2022

(87) PCT Pub. No.: WO2022/036852
PCT Pub. Date: Feb. 24, 2022

(65) Prior Publication Data
US 2023/0267024 A1    Aug. 24, 2023

(30) Foreign Application Priority Data
Aug. 20, 2020  (CN) .......................... 202010844796.4

(51) Int. Cl.
*G06F 9/50* (2006.01)
*G06F 8/41* (2018.01)
*G06F 9/54* (2006.01)

(52) U.S. Cl.
CPC .............. *G06F 9/547* (2013.01); *G06F 8/451* (2013.01)

(58) Field of Classification Search
CPC ................................ G06F 9/547; G06F 8/451
See application file for complete search history.

(56) References Cited

U.S. PATENT DOCUMENTS 10,761,821 B1 * 9/2020 Eble .......................... G06T 1/20
2016/0371081 A1 * 12/2016 Powers ............... G06F 9/45504
(Continued)

FOREIGN PATENT DOCUMENTS

| CN | 106528171 A | 3/2017 |
| CN | 109447256 A | 3/2019 |

(Continued)

OTHER PUBLICATIONS

The Mind of the Machines. "Intel Open SourcenGraph Compiler Easy Model Deployment From Multiple Frameworks to Multiple Device." https://baijiahao.baidu.com/s?id=1595539624466877556andwfr=spiderandfor=pcksearchword=ngraph. Mar. 21, 2018.
(Continued)

*Primary Examiner* — Abdullahi E Salad
(74) *Attorney, Agent, or Firm* — IPRO, PLLC

(57) ABSTRACT

Disclosed are a method for realizing an nGraph framework supporting an FPGA backend device, and a related apparatus. The method includes: integrating an OpenCL standard API library into an nGraph framework; creating, in the nGraph framework, an FPGA backend device creation module for registering an FPGA rear-end device, initializing an OpenCL environment and acquiring the FPGA backend device; creating, in the nGraph framework, an FPGA buffer space processing module for opening up an FPGA buffer space and for reading and writing an FPGA cache; creating, in the nGraph framework, an OP kernel implementation module for creating an OP kernel and compiling the OP kernel; and creating, in the nGraph framework, an FPGA compiling execution module for registering, scheduling and executing the OP kernel.

20 Claims, 3 Drawing Sheets

(56) References Cited

U.S. PATENT DOCUMENTS

2019/0324810 A1   10/2019  Zhao et al.
2022/0366008 A1*  11/2022  Shin ..................... G06F 9/544

FOREIGN PATENT DOCUMENTS

| CN | 110389763  | A  | 10/2019 |
| CN | 10399234   | A  | 11/2019 |
| CN | 110781126  | A  | 2/2020  |
| CN | 110929883  | A  | 3/2020  |
| CN | 111124656  | A  | 5/2020  |
| CN | 111198843  | A  | 5/2020  |
| CN | 111459871  | A  | 7/2020  |
| CN | 111490946  | A  | 8/2020  |
| WO | 2020087072 | A1 | 4/2020  |

OTHER PUBLICATIONS

"Multi-core and Multi-core Programming Handout—The OpenCL Way." AMD Shanghai Research Center. Mar. 31, 2020.
Handsome brother in the world. "Gadi Singer Intel is ready for the future of artificial intelligence!" Yixin Community. Jul. 19, 2018.
PCT/CN2021/076972 international search report.
CN 202010614692.4 first office action.

* cited by examiner

METHOD FOR REALIZING NGRAPH FRAMEWORK SUPPORTING FPGA REAR-END DEVICE

CROSS-REFERENCE TO RELATED APPLICATIONS

The present application is a National Stage of International Application No. PCT/CN2020/123809, filed on Oct. 27, 2020, which claims the benefit of priority to Chinese patent application No. 202010844796.4, filed on Aug. 20, 2020 before the CNIPA, China National Intellectual Property Administration, entitled "METHOD FOR REALIZING NGRAPH FRAMEWORK SUPPORTING FPGA BACKEND DEVICE", both of which are incorporated herein by reference in their entireties.

FIELD

The present application relates to the technical field of training super heterogeneous acceleration by using a deep learning model, in particular to a method for realizing an nGraph framework supporting an FPGA backend device, and further relates to an apparatus and device for realizing an nGraph framework supporting an FPGA backend device, and an nGraph framework supporting an FPGA backend device.

BACKGROUND

At present, deep neural networks (DNNs) have been widely in various applications, including image and video classification, speech recognition and language translation. However, the more the deep neural networks are widely developed and used, the larger the size of a DNN model, for example, up to hundreds of layers, with a total of 10 to 20 million parameters. Such increasement makes efficient model training even more important. The emergence of deep learning frameworks such as Tensorflow and pytorch, as well as various hardware accelerators such as GPU, FPGA, and ASIC chips, makes a great contribution to the improvement of training performance of neural networks. However, different deep learning frameworks, and different hardware accelerators have very different working principles as well as development and optimization methods. When a developer wants to change deep learning frameworks or deploy deep learning models to other more advanced devices during development engineering, it takes a lot of effort and time for the developer to perform migration and optimization. In view of these issues, the Intel Corp. has proposed nGraph framework, which is a deep neural network model compiler for various devices and frameworks, greatly simplifies the complexity of operations such as optimizing deep learning performance across frameworks and hardware platforms, and extends the applicability and portability of deep learning models. Currently, the nGraph framework has supported or is developing to support front-end deep learning frameworks such as Tensorflow, MXNet, and Paddle Paddle, and back-end hardware acceleration devices such as CPUs, NNPs, and various GPUs.

In addition to the acceleration devices such as CPUs, NNPs, and various GPUs, field programmable gate arrays (FPGAs) have become one of the best choices for improving server performance and reducing power consumption in data centers due to low power consumption, programmability, and high parallelism. An FPGA heterogeneous computing platform adopts a high-level integrated programming model, calls open computing language (OpenCL) to study and optimize deep learning neural networks, and completes the efficient porting and deployment of neural network algorithms on FPGA platforms. The computational performance of the deep learning neural network algorithms may be greatly improved by making full use of the board hardware flow design and task-level parallelism. However, at present, the nGraph framework does not support an FPGA backend device. If the nGraph framework may support the FPGA backend device, due to properties of FPGAs, such as low power consumption, programmability, and high parallelism, a great boost would undoubtedly be provided to further improve the training performance of deep learning neural networks.

Therefore, how to enable the nGraph framework to support the FPGA backend device has become an urgent technical problem to be solved by those skilled in the art.

SUMMARY

An objective of the present application is to provide a method for realizing an nGraph framework supporting an FPGA backend device. Another objective of the present application is to provide an apparatus and device for realizing an nGraph framework supporting the FPGA backend device, and an nGraph framework supporting the FPGA backend device.

In order to solve the above technical problem, the present application provides a method for realizing an nGraph framework supporting an FPGA backend device, including: integrating an open computing language (OpenCL) standard API library into the nGraph framework; creating, based on the OpenCL standard API library, an FPGA backend device creation module configured to register the FPGA backend device, initialize an OpenCL environment, and acquire the FPGA backend device, in the nGraph framework; creating, based on the OpenCL standard API library, an FPGA buffer space processing module configured to open up an FPGA buffer space, and read and write an FPGA buffer, in the nGraph framework; creating, based on the OpenCL standard API library, an operation (OP) kernel implementation module configured to create an OP kernel and compile the OP kernel, in the nGraph framework; and creating, based on the OpenCL standard API library, an FPGA compiling execution module configured to register, schedule and execute the OP kernel, in the nGraph framework.

In some embodiments, the integrating an OpenCL standard API library into the nGraph framework includes: adding the OpenCL standard API library to a source code of the nGraph framework; and modifying a cmake compiling file of the nGraph framework to compile the OpenCL standard API library into a dynamic link library within the nGraph framework.

In some embodiments, the creating, based on the OpenCL standard API library, a FPGA backend device creation module configured to register a FPGA backend device, initialize an OpenCL environment, and acquire the FPGA backend device, in the nGraph framework includes: creating, in the nGraph framework, a FPGA backend device registration sub-module configured to register a FPGA backend device; creating, based on the OpenCL standard API library, an OpenCL environment initialization sub-module configured to initialize the OpenCL environment, in the nGraph framework; and creating, based on the OpenCL standard API library, a FPGA backend device acquisition sub-module configured to acquire the FPGA backend device, in the nGraph framework.

In some embodiments, the creating, based on the OpenCL standard API library, a FPGA buffer space processing module configured to open up a FPGA buffer space, and read and write a FPGA buffer, in the nGraph framework includes: creating, based on the OpenCL standard API library, a FPGA buffer space opening-up sub-module configured to open up the FPGA buffer space, in the nGraph framework; creating, based on the OpenCL standard API library, a write FPGA buffer sub-module configured to write data to be processed from HOST to the FPGA buffer, in the nGraph framework; and creating, based on the OpenCL standard API library, a read FPGA buffer sub-module configured to read a data processing result from the FPGA buffer and return the data processing result to the HOST, in the nGraph framework.

In some embodiments, the creating, based on the OpenCL standard API library, an operation (OP) kernel implementation module configured to create an OP kernel and compile the OP kernel, in the nGraph framework includes: creating, in the nGraph framework, an OP kernel creation sub-module configured to create an OP kernel supported by a FPGA backend device; and creating, in the nGraph framework, an OP kernel compiling sub-module configured to compile the OP kernel and acquire a aocx file obtained through compiling.

In some embodiments, the creating, based on the OpenCL standard API library, a FPGA compiling execution module configured to register, schedule and execute the OP kernel, in the nGraph framework includes: creating, in the nGraph framework, an OP kernel registration sub-module configured to register the OP kernel; creating, in the nGraph framework, a computational graph optimization sub-module configured to optimize a computational graph; and creating, in the nGraph framework, an OP kernel scheduling and execution sub-module configured to determine an execution order of each OP in the computational graph, and start the OP kernel for computation according to the execution order.

In order to solve the above technical problem, the present application further provides an apparatus for realizing an nGraph framework supporting an FPGA backend device, including: an integration unit, configured to integrate an open computing language (OpenCL) standard application programming interface (API) library into the nGraph framework; a first creation unit, configured to create, based on the OpenCL standard API library, a FPGA backend device creation module configured to register a FPGA backend device, initialize an OpenCL environment, and acquire the FPGA backend device, in the nGraph framework; a second creation unit, configured to create, based on the OpenCL standard API library, a FPGA buffer space processing module configured to open up a FPGA buffer space, and read and write a FPGA buffer, in the nGraph framework; a third creation unit, configured to create, based on the OpenCL standard API library, an OP kernel implementation module configured to create an OP kernel and compile the OP kernel, in the nGraph framework; and a fourth creation unit, configured to create, in the nGraph framework, a FPGA compiling execution module configured to register, schedule and execute the OP kernel.

In order to solve the above technical problem, the present application further provides an nGraph framework supporting an FPGA backend device, including: an open computing language (OpenCL) standard application programming interface (API) library; a FPGA backend device creation module, configured to register a FPGA backend device, initialize an OpenCL environment, and acquire the FPGA backend device; a FPGA buffer space processing module, configured to open up a FPGA buffer space, and read and write a FPGA buffer; an OP kernel implementation module, configured to create an OP kernel and compile the OP kernel; and a FPGA compiling execution module, configured to register, schedule and execute the OP kernel.

In some embodiments, the FPGA backend device creation module includes: a FPGA backend device registration sub-module, configured to register a FPGA backend device; an OpenCL environment initialization sub-module, configured to initialize the OpenCL environment; and a FPGA backend device acquisition sub-module, configured to acquire the FPGA backend device.

In order to solve the above technical problem, the present application further provides a device for realizing an nGraph framework supporting an FPGA backend device, including: a memory, configured to store a computer program; and a processor, configured to, when executing the computer program, perform the steps of the method for realizing the nGraph framework supporting the FPGA backend device described above.

The method for realizing an nGraph framework supporting the FPGA backend device provided by the present application includes: integrating an OpenCL standard API library into the nGraph framework; creating, based on the OpenCL standard API library, an FPGA backend device creation module configured to register the FPGA backend device, initialize an OpenCL environment, and acquire the FPGA backend device, in the nGraph framework; creating, based on the OpenCL standard API library, an FPGA buffer space processing module configured to open up an FPGA buffer space, and read and write an FPGA buffer, in the nGraph framework; creating, based on the OpenCL standard API library, an operation (OP) kernel implementation module configured to create an OP kernel and compile the OP kernel, in the nGraph framework; and creating, based on the OpenCL standard API library, an FPGA compiling execution module configured to register, schedule and execute the OP kernel, in the nGraph framework.

BRIEF DESCRIPTION OF THE DRAWINGS

The accompanying drawings as used in the description of embodiments of the present disclosure or related art will be briefly introduced below so as to clearly illustrate solutions of the embodiments of the present disclosure. It is apparent that the accompanying drawings in the following description illustrate merely some embodiments of the present disclosure, and those skilled in the art may obtain other accompanying drawings based on these accompanying drawings without paying any creative efforts. In the figures.

DETAILED DESCRIPTION OF THE EMBODIMENTS

The core of the present application is to provide a method for realizing an nGraph framework supporting an FPGA backend device, so that the nGraph framework may support the FPGA backend device, and the training or inference process of a deep learning neural network computational graph built by a user based on the nGraph framework is further deployed to the FPGA backend device for acceleration. Another core of the present application is to provide an apparatus and device for realizing an nGraph framework supporting the FPGA backend device, and an nGraph framework supporting the FPGA backend device, which also have the above technical effects.

In order to make the objective, technical solutions and advantages of the embodiments of the present application clearer, technical solutions in embodiments of the present disclosure will be clearly and completely described below with reference to the accompanying drawings in the embodiments of the present disclosure. It is apparent that only a part of the embodiments, not all the embodiments of the present application, are described. All other embodiments obtained, based on the embodiments described in the present disclosure, by those skilled in the art without paying creative efforts shall fall within the protection scope of the present application.

Figure 1:
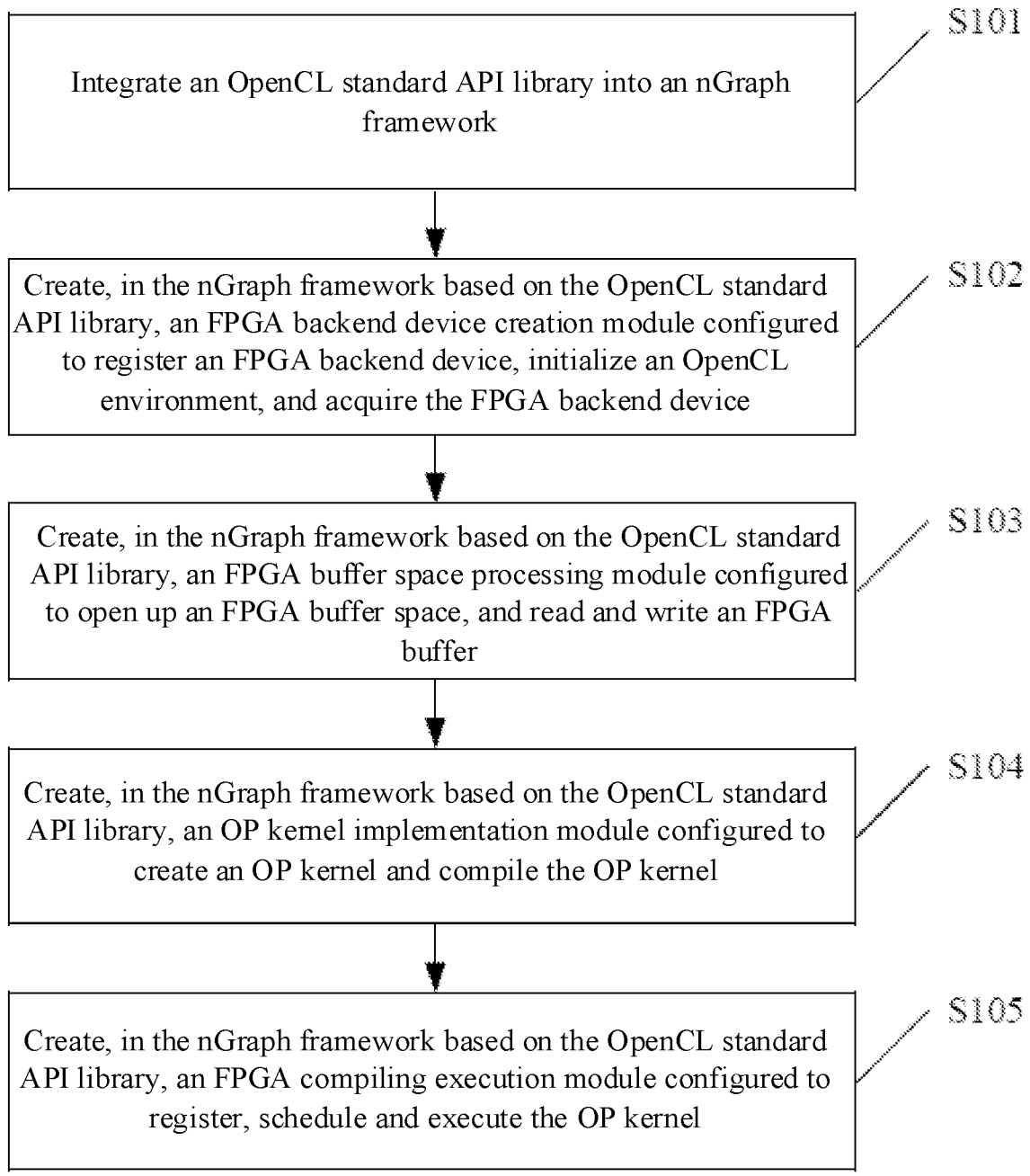
FIG. 1 is a schematic flow diagram illustrating a method for realizing an nGraph framework supporting an FPGA backend device provided by an embodiment of the present disclosure.

FIG. 1 is a schematic flow diagram illustrating a method for realizing an nGraph framework supporting an FPGA backend device provided by an embodiment of the present application. Referring to FIG. 1, the method includes steps described below.

In S101, an open computing language (OpenCL) standard application programming interface (API) library is integrated into the nGraph framework.

Figure 2:
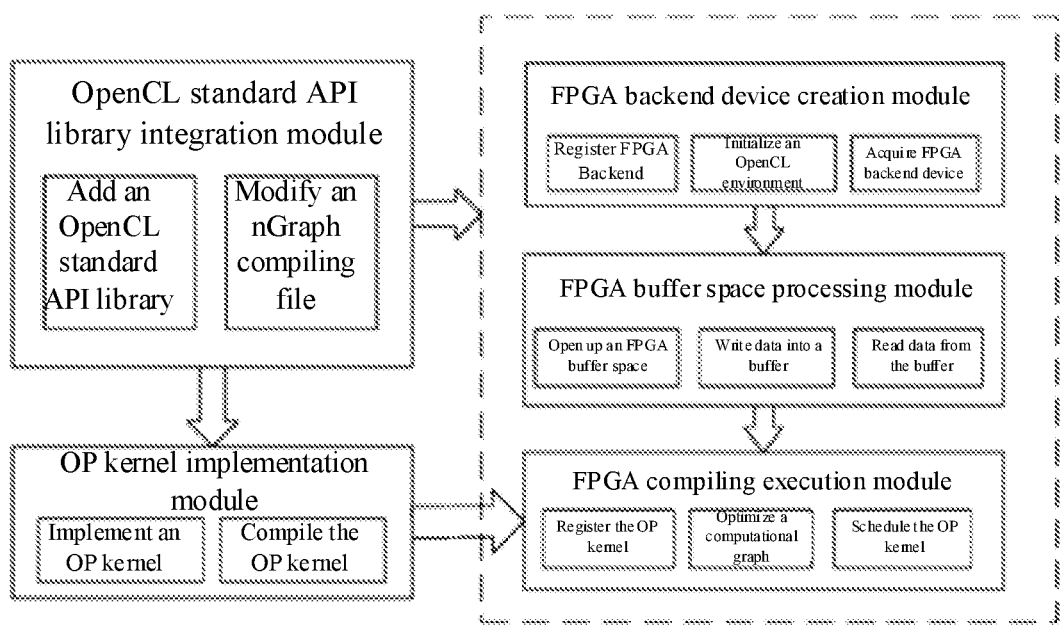
FIG. 2 is a schematic diagram illustrating functional modules for realizing an nGraph framework supporting an FPGA backend device provided by an embodiment of the present disclosure.

In this regard, OpenCL is a standard API and programming language for parallelized computation on heterogeneous apparatuses. Compared with conventional FPGA algorithm development and http live streaming (HLS) development, by developing the FPGA backend device based on OpenCL high-level integrated programming software, the FPGA development process may be greatly simplified and the development cycle is shortened. This step aims to integrate the OpenCL standard API library into the nGraph framework to be used for subsequent development of the FPGA backend device. Referring to FIG. 2, an OpenCL standard API library integration module may be created, and the OpenCL standard API library may be integrated into the nGraph framework through the OpenCL standard API library integration module.

The OpenCL standard API library may be integrated into the nGraph framework by the following steps: adding the OpenCL standard API library to a source code of the nGraph framework; and modifying a cmake compiling file of the nGraph framework to compile the OpenCL standard API library into a dynamic link library within the nGraph framework.

In this regard, first, the OpenCL standard API library is added to the source code of the nGraph framework. Since the OpenCL standard API library is used for development of the FPGA backend device, the OpenCL standard API library is added to a location, under the same directory as the FPGA backend device, in the source code of the nGraph framework. After adding the OpenCL standard API library to the source code of the nGraph framework, the cmake compiling file of the nGraph framework is further modified to compile the OpenCL standard API library into the dynamic link library within the nGraph framework. In this way, the OpenCL standard API library is integrated with the nGraph framework and may be used by other modules in the nGraph framework.

In S102, an FPGA backend device creation module configured to register the FPGA backend device, initialize an OpenCL environment, and acquire the FPGA backend device is created, based on the OpenCL standard API library, in the nGraph framework.

In this regard, this step aims to create the FPGA backend device creation module in the nGraph framework. The FPGA backend device creation module is configured to register a FPGA backend device, initialize the OpenCL environment, and acquire the FPGA backend device in the nGraph framework.

The FPGA backend device creation module configured to register the FPGA backend device, initialize the OpenCL environment, and acquire the FPGA backend device is created, based on the OpenCL standard API library, in the nGraph framework by the following steps: in the nGraph framework, creating, an FPGA backend device registration sub-module configured to register an FPGA backend device; in the nGraph framework, creating, based on the OpenCL standard API library, an OpenCL environment initialization sub-module configured to initialize the OpenCL environment; and in the nGraph framework, creating, based on the OpenCL standard API library, an FPGA backend device acquisition sub-module configured to acquire the FPGA backend device.

In this regard, in this embodiment, the FPGA backend device creation module includes the FPGA backend device registration sub-module, the OpenCL environment initialization sub-module, and the FPGA backend device acquisition sub-module.

The FPGA backend device registration sub-module is configured to register the FPGA backend device in the nGraph framework by constructing an FPGA backend device global registration function ngraph_register_fpga_backend( ) based on a function BackendManager:register_backend( ) provided by the nGraph framework.

The functions of the OpenCL environment initialization sub-module depend on the OpenCL standard API library, and the OpenCL environment initialization sub-module is configured to initialize the OpenCL environment by calling an OpenCL standard API library function.

The functions of the FPGA backend device acquisition sub-module also depend on the OpenCL standard API library, and the FPGA backend device acquisition sub-module is configured to acquire, by calling an OpenCL standard API library function, the FPGA backend device for subsequent use.

In S103, in the nGraph framework, an FPGA buffer space processing module configured to open up an FPGA buffer space, and read and write the FPGA buffer is created based on the OpenCL standard API library.

In this regard, this step aims to create the FPGA buffer space processing module in the nGraph framework. The FPGA buffer space processing module is configured to open up the FPGA buffer space, and read and write the FPGA buffer, i.e., write data to and read data from the FPGA buffer.

The FPGA buffer space processing module, configured to open up the FPGA buffer space, and read and write the FPGA buffer, is created, based on the OpenCL standard API library, in the nGraph framework by the following steps: in the nGraph framework, creating, based on the OpenCL standard API library, an FPGA buffer space opening-up sub-module configured to open up the FPGA buffer space for data to be processed; in the nGraph framework, creating, based on the OpenCL standard API library, a write FPGA buffer sub-module configured to write the data to be processed from HOST to the FPGA buffer space; and in the nGraph framework, creating, based on the OpenCL standard API library, a read FPGA buffer sub-module configured to read a data processing result from the FPGA buffer and return the data processing result to the HOST.

In this regard, the FPGA buffer space processing module in this embodiment includes the FPGA buffer space opening-up sub-module, the Write FPGA buffer sub-module, and the Read FPGA buffer sub-module.

The FPGA buffer space opening-up sub-module is mainly configured to open up the FPGA buffer space, and is also configured to create FPGA Tensor, calculate the size of a space required for Tensor data to be processed, and perform Tensor data layout. The process of opening up the FPGA buffer space depends on the OpenCL standard API library, and the operation of opening up the FPGA buffer space is completed by calling an OpenCL standard API library function.

The Write FPGA buffer sub-module is configured to write the data to be processed from the HOST to the buffer of the FPGA backend device by calling an OpenCL standard API library function, so that the FPGA backend device may perform computation on the data.

The Read FPGA buffer sub-module is configured to read the computation result from the buffer of the FPGA backend device by calling an OpenCL standard API library function, and return the computation result to the HOST.

In S104, an operation (OP) kernel implementation module configured to create and compile an OP kernel is created, in the nGraph framework, based on the OpenCL standard API library.

In this regard, this step aims to create the OP kernel implementation module in the nGraph framework. The OP kernel implementation module is mainly configured to create the OP kernel and compile the OP kernel. OP represents a computational node in the computational graph, and a kernel of OP on the FPGA backend device is referred to as the OP kernel.

The OP kernel implementation module configured to create and compile the OP kernel the OP kernel is created, in the nGraph framework, based on the OpenCL standard API library by the following steps: creating, in the nGraph framework, an OP kernel creation sub-module configured to create an OP kernel supported by the FPGA backend device; and creating, in the nGraph framework, an OP kernel compiling sub-module configured to compile the OP kernel to acquire an aocx file.

In this regard, the OP kernel implementation module in this embodiment includes the OP kernel creation sub-module and the OP kernel compiling sub-module. The OP kernel creation sub-module uses the OpenCL high-level programming language to write kernels for forward and backward computations of each OP supported by the FPGA, and to optimize the kernels in parallel. The OP kernel compiling sub-module is configured to compile the created OP kernels through aoc to acquire the aocx file. The aocx file is placed under a new FPGA directory in the nGraph framework for subsequent use.

In S105, an FPGA compiling execution module configured to register, schedule and execute the OP kernel is created, in the nGraph framework, based on the OpenCL standard API library.

In this regard, this step aims to create the FPGA compiling execution module in the nGraph framework. The FPGA compiling execution module is configured to register, schedule and execute the OP kernel.

The FPGA compiling execution module configured to register, schedule and execute the OP kernel is created, in the nGraph framework, based on the OpenCL standard API library by the following steps: creating, in the nGraph framework, an OP kernel registration sub-module configured to register the OP kernel; creating, in the nGraph framework, a computational graph optimization sub-module configured to optimize the computational graph; and creating, in the nGraph framework, an OP kernel scheduling and execution sub-module configured to determine an execution order of each of OPs in the computational graph, and start the OP kernel for computation according to the execution order.

In this regard, the FPGA compiling execution module in this embodiment includes the OP kernel registration sub-module, the computational graph optimization sub-module, and the OP kernel scheduling and execution sub-module.

The OP kernel registration sub-module is configured to register the OP kernel by defining an FPGA kernel registration list and an FPGA kernel registration function, so that the FPGA backend device may recognize and call the OP kernel later.

The computational graph optimization sub-module is configured to optimize the computational graph created by the client by reusing partial codes of pass optimization of a graph in the nGraph framework and adding optimization pass for the FPGA backend device, so as to improve the training performance.

The OP kernel scheduling and execution sub-module is configured to determine the execution order of OPs in the computational graph, find OPs to be computed from the registration list, and start the OP kernel for computation based on the execution order of OPs.

Figure 3:
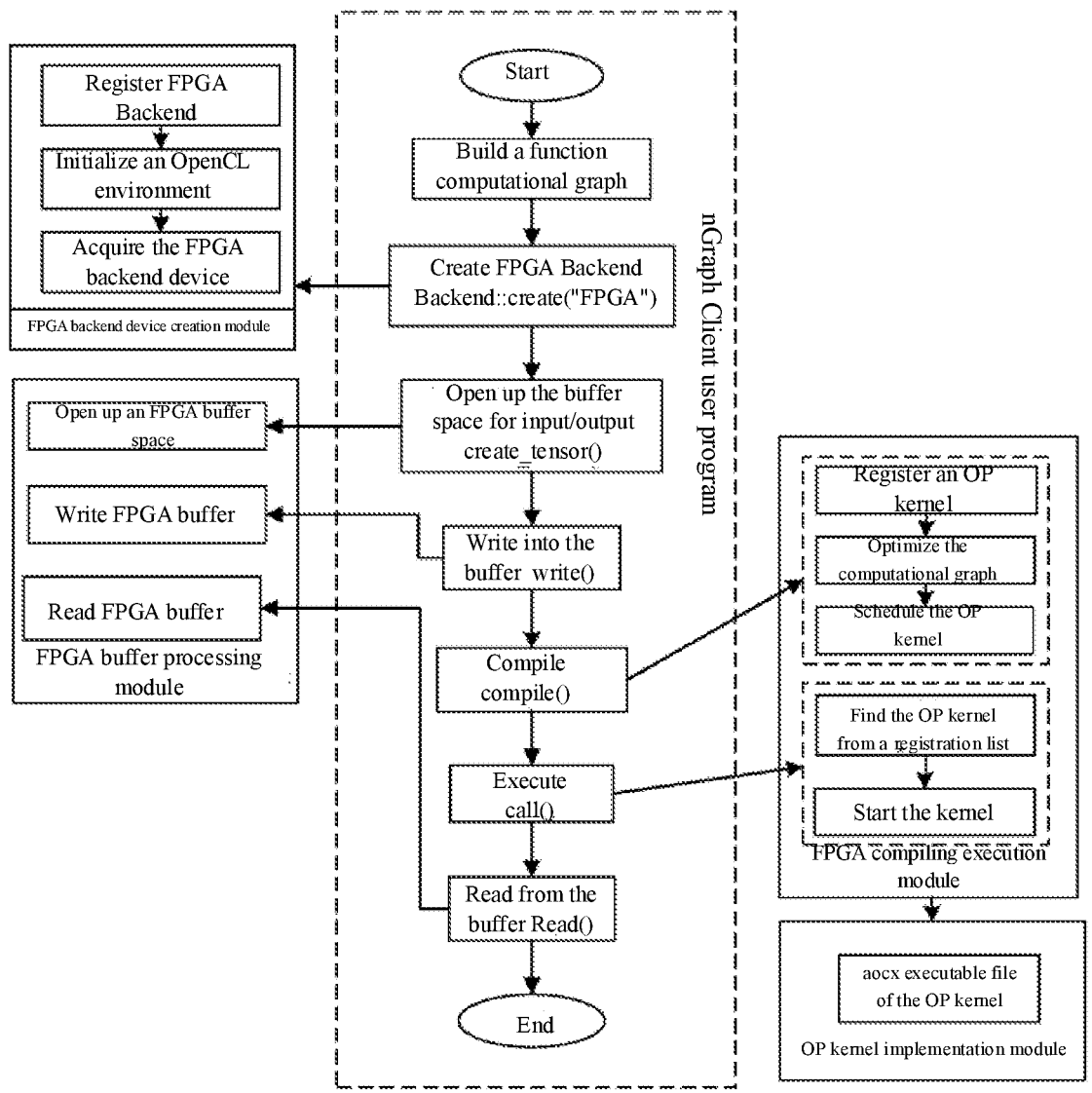
FIG. 3 is a schematic diagram illustrating an association between an nGraph client development program and an FPGA backend device provided by an embodiment of the present disclosure.

Upon completion of the above steps, the nGraph framework is enabled to support the FPGA backend device. Referring to FIG. 3, an nGraph client user may develop a program according to original programming habits, and may use the FPGA backend device to perform training or inference acceleration on the deep learning neural network built by the user by simply specifying a backend device as "FPGA" when creating the backend device. In this regard, if the user wishes to use the FPGA backend device, when creating Backend by calling a function of Backend::create( ), he or she only needs to specify that a backend device to be used is an FPGA device with Backend::create ("FPGA"). Upon specifying the backend device as the FPGA, the subsequent process may automatically call the modules created in the above steps to execute corresponding operations. Finally, the purpose of deploying the training or inference process of the deep learning neural network computational graph built by the user based on the nGraph framework to the FPGA backend device for acceleration is realized.

As shown in FIG. 3, according to an nGraph Client user program, after building a function computational graph, Backend::create("FPGA") is used to create a FPGA Backend, and then the FPGA backend device creation module performs the operations of registering FPGA Backend, initializing the OpenCL environment, and acquiring the FPGA backend device. When functions of create_tensor( ) write( ) and read( ) are executed according to the nGraph Client user program, the FPGA buffer space processing module correspondingly performs the operations of FPGA buffer space openup, writing FPGA buffer and reading FPGA buffer respectively. When a function of compile( ) is executed according to the nGraph Client user program, the FPGA compiling execution module performs the operations of OP kernel registration, computational graph optimization and OP kernel scheduling. When a function of call( ) is executed according to the nGraph Client user program, the FPGA compiling execution module performs the operations of finding the OP kernel from the registration list and starting the kernel. Further, the OP kernel implementation module compiles the OP kernel to obtain the aocx executable file.

In summary, according to the method for realizing an nGraph framework supporting the FPGA backend device provided by the present disclosure, the OpenCL standard API library is integrated into the nGraph framework, and the FPGA backend device creation module, the FPGA buffer space processing module, the OP kernel implementation module and the FPGA compiling execution module are created in the nGraph framework based on the OpenCL standard API library. Once the OpenCL standard API library is integrated into the nGraph framework and the above-mentioned modules are created in the nGraph framework, the nGraph framework may support the FPGA backend device. In the process of programming and development, the FPGA backend device may be used to perform training or inference acceleration on a deep learning neural network built by the user only if the user specifies a backend device as the FPGA when creating the backend device and then the corresponding operations are performed through the above-mentioned modules.

The present application further provides an apparatus for realizing an nGraph framework supporting an FPGA backend device. The apparatus described hereinafter may be cross-referenced to the method described above. The apparatus includes an integration unit, a first creation unit, a second creation unit, a third creation unit and a fourth creation unit.

The integration unit is configured to integrate an OpenCL standard API library into the nGraph framework.

The first creation unit is configured to create, based on the OpenCL standard API library, an FPGA backend device creation module configured to register the FPGA backend device, initialize an OpenCL environment, and acquire the FPGA backend device, in the nGraph framework.

The second creation unit is configured to create, based on the OpenCL standard API library, an FPGA buffer space processing module configured to open up an FPGA buffer space, and read and write an FPGA buffer, in the nGraph framework.

The third creation unit is configured to create, based on the OpenCL standard API library, an OP kernel implementation module configured to create an OP kernel and compile the OP kernel, in the nGraph framework.

The fourth creation unit is configured to create, based on the OpenCL standard API library, an FPGA compiling execution module configured to register, schedule and execute the OP kernel, in the nGraph framework.

In some embodiments, on the basis of the above embodiment, the integration unit includes:
  an adding unit, configured to add the OpenCL standard API library to a source code of the nGraph framework; and
  a modifying unit, configured to modify a cmake compiling file of the nGraph framework, and compile the OpenCL standard API library into a dynamic link library within the nGraph framework.

In some embodiments, on the basis of the above embodiment, the first creation unit includes:

a registration sub-module creation unit, configured to create, in the nGraph framework, an FPGA backend device registration sub-module for registering the FPGA backend device;
  an initialization sub-module creation unit, configured to create, based on the OpenCL standard API library, an OpenCL environment initialization sub-module configured to initialize the OpenCL environment, in the nGraph framework; and
  an acquisition sub-module creation unit, configured to create, based on the OpenCL standard API library, an FPGA backend device acquisition sub-module configured to acquire the FPGA backend device, in the nGraph framework.

In some embodiments, on the basis of the above embodiment, the second creation unit includes:
  a buffer space opening-up sub-module creation unit, configured to create based on the OpenCL standard API library, an FPGA buffer space opening-up sub-module configured to open up the FPGA buffer space, in the nGraph framework;
  a write buffer sub-module creation unit, configured to create, based on the OpenCL standard API library, a write FPGA buffer sub-module configured to write data to be processed from HOST to the FPGA buffer, in the nGraph framework; and
  a read buffer sub-module creation unit, configured to create, based on the OpenCL standard API library, a read FPGA buffer sub-module configured to read a data processing result from the FPGA buffer and return the data processing result to the HOST, in the nGraph framework.

In some embodiments, on the basis of the above embodiment, the third creation unit includes:
  a kernel creation sub-module creation unit, configured to create, based on the OpenCL standard API library, an OP kernel creation sub-module configured to create an OP kernel supported by an FPGA backend device, in the nGraph framework; and
  a kernel compiling sub-module creation unit, configured to create, based on the OpenCL standard API library, an OP kernel compiling sub-module configured to compile the OP kernel to acquire an aocx, in the nGraph framework.

In some embodiments, on the basis of the above embodiment, the fourth creation unit includes:
  a kernel registration sub-module creation unit, configured to create, in the nGraph framework, an OP kernel registration sub-module configured to register the OP kernel;
  a computational graph optimization sub-module creation unit, configured to create, in the nGraph framework, a computational graph optimization sub-module configured to optimize a computational graph; and
  a kernel scheduling and execution sub-module creation unit, configured to create, in the nGraph framework, an OP kernel scheduling and execution sub-module configured to determine an execution order of each of OPs in the computational graph, and start the OP kernel for computation according to the execution order.

The present application further provides an nGraph framework supporting an FPGA backend device. The nGraph framework includes an OpenCL standard API library, an FPGA backend device creation module, an FPGA buffer space processing module, an OP kernel implementation module and an FPGA compiling execution module.

The FPGA backend device creation module is configured to register the FPGA backend device, initialize an OpenCL environment, and acquire the FPGA backend device.

The FPGA buffer space processing module is configured to open up an FPGA buffer space, and read and write an FPGA buffer.

The OP kernel implementation module is configured to create an OP kernel and compile the OP kernel.

The FPGA compiling execution module is configured to register, schedule and execute the OP kernel.

In some embodiments, on the basis of the above embodiment, the FPGA backend device creation module includes:
an FPGA backend device registration sub-module, configured to register the FPGA backend device;
an OpenCL environment initialization sub-module, configured to initialize the OpenCL environment; and
an FPGA backend device acquisition sub-module, configured to acquire the FPGA backend device.

In some embodiments, on the basis of the above embodiment, the FPGA buffer space processing module includes:
an FPGA buffer space opening-up sub-module, configured to open up the FPGA buffer space;
a write FPGA buffer sub-module, configured to write data to be processed from HOST to the FPGA buffer; and
a read FPGA buffer sub-module, configured to read a data processing result from the FPGA buffer and return the data processing result to the HOST.

In some embodiments, on the basis of the above embodiment, the OP kernel implementation module includes:
an OP kernel creation sub-module, configured to create an OP kernel supported by an FPGA backend device; and
an OP kernel compiling sub-module, configured to compile the OP kernel to acquire an aocx file.

In some embodiments, on the basis of the above embodiment, the FPGA compiling execution module includes:
an OP kernel registration sub-module, configured to register the OP kernel;
a computational graph optimization sub-module, configured to optimize a computational graph; and
an OP kernel scheduling and execution sub-module, configured to determine an execution order of each OP in the computational graph, and start the OP kernel for computation according to the execution order.

Figure 4:
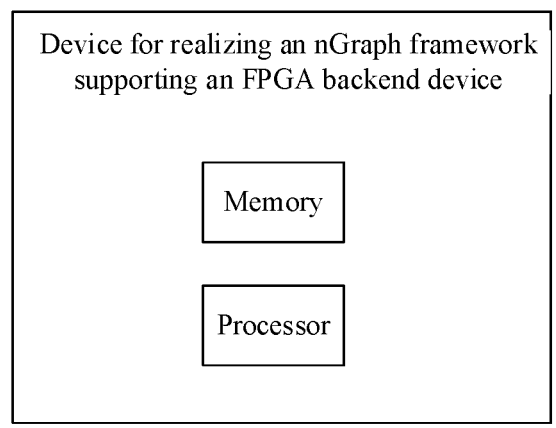
FIG. 4 is a schematic diagram illustrating a device for realizing an nGraph framework supporting an FPGA backend device provided by an embodiment of the present disclosure.

The present application further provides a device for realizing an nGraph framework supporting an FPGA backend device. Referring to FIG. 4, the device includes a memory and a processor. The memory is configured to store a computer program. The processor is configured to, when executing the computer program, implement the following steps:
integrating an OpenCL standard API library into the nGraph framework; creating, based on the OpenCL standard API library, an FPGA backend device creation module configured to register the FPGA backend device, initialize an OpenCL environment, and acquire the FPGA backend device, in the nGraph framework; creating, based on the OpenCL standard API library, an FPGA buffer space processing module configured to open up an FPGA buffer space, and read and write an FPGA buffer, in the nGraph framework; creating, based on the OpenCL standard API library, an OP kernel implementation module configured to create an OP kernel and compile the OP kernel, in the nGraph framework; and creating, based on the OpenCL standard API library, an FPGA compiling execution module configured to register, schedule and execute the OP kernel, in the nGraph framework.

For a description of the device according to the present application, reference is made to the above-mentioned method embodiment, which will not be repeated in the present application.

Various embodiments described in the description are described in a progressive manner, each embodiment focuses on the difference from other embodiments, and the same or similar parts of each embodiment can be referred to each other. The apparatus, device and computer-readable medium disclosed in the embodiment correspond to the method disclosed in the embodiment, thus the description thereof is relatively simple, and for the related information, please refer to the description of the method.

Those skilled in the art can further realize that the exemplary units and algorithm steps described in conjunction with the embodiments disclosed herein can be implemented by electronic hardware, computer software, or a combination of the two. In order to clearly illustrate the interchangeability between hardware and software, the composition and steps of each example have been generally described according to their functions in the above description. Whether these functions are executed by hardware or software depends on the specific application and design constraints of the technical solution. Those skilled in the art may use different methods to implement the described functions for each specific application, but such implementation should not be regarded as exceeding the scope of the present disclosure.

The steps of the methods or algorithms described in connection with the embodiments disclosed herein may be directly implemented by hardware, software modules executed by a processor, or a combination of both. Software modules can be placed in random access memory (RAM), internal memory, read-only memory (ROM), electrically programmable ROM, electrically erasable programmable ROM, registers, hard disk, removable disk, CD-ROM, or any other storage medium known in the technical field.

The technical solutions provided by the present application have been introduced in detail above. Herein, specific examples are used to illustrate the principles and implementation methods of the present application, and the descriptions of the above embodiments are only used to help understand the methods and core ideas of the present application. It should be pointed out that those skilled in the art can make some improvements and modifications to the application without departing from the principles of the application, and these improvements and modifications also fall within the protection scope of the claims of the present disclosure.

The invention claimed is:

1. A method for realizing an nGraph framework supporting a field programmable gate array (FPGA) backend device, comprising:
integrating an open computing language (OpenCL) standard application programming interface (API) library into the nGraph framework;
creating, based on the OpenCL standard API library, a FPGA backend device creation module configured to register a FPGA backend device, initialize an OpenCL environment, and acquire the FPGA backend device, in the nGraph framework;
creating, based on the OpenCL standard API library, a FPGA buffer space processing module configured to open up a FPGA buffer space, and read and write a FPGA buffer, in the nGraph framework;
creating, based on the OpenCL standard API library, an operation (OP) kernel implementation module configured to create an OP kernel and compile the OP kernel, in the nGraph framework; and creating, based on the OpenCL standard API library, a FPGA compiling execution module configured to register, schedule and execute the OP kernel, in the nGraph framework.

2. The method according to claim 1, wherein the integrating an open computing language (OpenCL) standard application programming interface (API) library into the nGraph framework comprises:

adding the OpenCL standard API library to a source code of the nGraph framework; and modifying a cmake compiling file of the nGraph framework to compile the OpenCL standard API library into a dynamic link library within the nGraph framework.

3. The method according to claim 2, wherein the adding the OpenCL standard API library to a source code of the nGraph framework comprises:

adding the OpenCL standard API library to a directory same as the FPGA backend device, in the source code.

4. The method according to claim 2, wherein the creating, based on the OpenCL standard API library, a FPGA backend device creation module configured to register a FPGA backend device, initialize an OpenCL environment, and acquire the FPGA backend device, in the nGraph framework comprises:

creating, in the nGraph framework, a FPGA backend device registration sub-module configured to register a FPGA backend device;

creating, based on the OpenCL standard API library, an OpenCL environment initialization sub-module configured to initialize the OpenCL environment, in the nGraph framework; and creating, based on the OpenCL standard API library, a FPGA backend device acquisition sub-module configured to acquire the FPGA backend device, in the nGraph framework.

5. The method according to claim 4, wherein the creating, based on the OpenCL standard API library, a FPGA buffer space processing module configured to open up a FPGA buffer space, and read and write a FPGA buffer, in the nGraph framework comprises:

creating, based on the OpenCL standard API library, a FPGA buffer space opening-up sub-module configured to open up the FPGA buffer space, in the nGraph framework;

creating, based on the OpenCL standard API library, a write FPGA buffer sub-module configured to write data to be processed from HOST to the FPGA buffer, in the nGraph framework; and creating, based on the OpenCL standard API library, a read FPGA buffer sub-module configured to read a data processing result from the FPGA buffer and return the data processing result to the HOST, in the nGraph framework.

6. The method according to claim 5, wherein the FPGA buffer space opening-up sub-module is further configured to create FPGA Tensor, calculate a size of a space required for Tensor data to be processed, and perform Tensor data layout.

7. The method according to claim 5, wherein the creating, based on the OpenCL standard API library, an operation (OP) kernel implementation module configured to create an OP kernel and compile the OP kernel, in the nGraph framework comprises:

creating, in the nGraph framework, an OP kernel creation sub-module configured to create an OP kernel supported by a FPGA backend device; and creating, in the nGraph framework, an OP kernel compiling sub-module configured to compile the OP kernel to acquire an aocx file.

8. The method according to claim 7, wherein the OP kernel creation sub-module is configured to use an OpenCL high-level programming language to write kernels for forward and backward computations of each of OPs supported by the FPGA, and to optimize the kernels in parallel.

9. The method according to claim 7, wherein the aocx file is placed under a new FPGA directory in the nGraph framework.

10. The method according to claim 7, wherein the creating, based on the OpenCL standard API library, a FPGA compiling execution module configured to register, schedule and execute the OP kernel, in the nGraph framework comprises:

creating, in the nGraph framework, an OP kernel registration sub-module configured to register the OP kernel;

creating, in the nGraph framework, a computational graph optimization sub-module configured to optimize a computational graph; and creating, in the nGraph framework, an OP kernel scheduling and execution sub-module configured to determine an execution order of each of OPs in the computational graph, and start the OP kernel for computation according to the execution order.

11. The method according to claim 10, wherein the OP kernel registration sub-module is configured to register the OP kernel by defining an FPGA kernel registration list and an FPGA kernel registration function.

12. The method according to claim 10, wherein the computational graph optimization sub-module is configured to optimize a computational graph by reusing partial codes of pass optimization of a graph in the nGraph framework and adding optimization pass for the FPGA backend device.

13. The method according to claim 10, wherein the OP kernel scheduling and execution sub-module is configured to determine the execution order of OPs in the computational graph, find OPs to be computed from the registration list, and start the OP kernel for computation according to the execution order of Ops.

14. The method according to claim 4, wherein the FPGA backend device registration sub-module is further configured to register the FPGA backend device in the nGraph framework by constructing an FPGA backend device global registration function ngraph_register_fpga_backend( ) based on a function BackendManager::register_backend( ) provided by the nGraph framework.

15. The method according to claim 4, wherein the OpenCL environment initialization sub-module is further configured to initialize the OpenCL environment by calling an OpenCL standard API library function.

16. The method according to claim 4, wherein the FPGA backend device acquisition sub-module is further configured to acquire the FPGA backend device by calling an OpenCL standard API library function.

17. The method according to claim 1, wherein the integrating an open computing language (OpenCL) standard application programming interface (API) library into the nGraph framework comprises:

creating an OpenCL standard API library integration module, and integrating the OpenCL standard API library into the nGraph framework through the OpenCL standard API library integration module.

18. An nGraph framework supporting a field programmable gate array (FPGA) backend device, comprising:

an open computing language (OpenCL) standard application programming interface (API) library;
a processor; and
a memory, configured to store a computer program,
wherein the processor is configured to call the computer program stored in the memory and run the computer program to:
register a FPGA backend device, initialize an OpenCL environment, and acquire the FPGA backend device;
open up a FPGA buffer space, and read and write a FPGA buffer;
create an OP kernel and compile the OP kernel; and
register, schedule and execute the OP kernel.

19. The nGraph framework according to claim 18, wherein the processor is further configured to:
register a FPGA backend device;
initialize the OpenCL environment; and
acquire the FPGA backend device.

20. A device for realizing an nGraph framework supporting a field programmable gate array (FPGA) backend device, comprising:
a memory, configured to store a computer program; and
a processor, configured to, when executing the computer program, perform the steps of:
integrating an open computing language (OpenCL) standard application programming interface (API) library into the nGraph framework;
creating, based on the OpenCL standard API library, a FPGA backend device creation module configured to register a FPGA backend device, initialize an OpenCL environment, and acquire the FPGA backend device, in the nGraph framework;
creating, based on the OpenCL standard API library, a FPGA buffer space processing module configured to open up a FPGA buffer space, and read and write a FPGA buffer, in the nGraph framework;
creating, based on the OpenCL standard API library, an operation (OP) kernel implementation module configured to create an OP kernel and compile the OP kernel, in the nGraph framework; and
creating, based on the OpenCL standard API library, a FPGA compiling execution module configured to register, schedule and execute the OP kernel, in the nGraph framework.

* * * * *